US012732176B2

(12) United States Patent
Liu et al.

(10) Patent No.: US 12,732,176 B2
(45) Date of Patent: Sep. 8, 2026

(54) LOW-JITTER RANDOM CLOCK GENERATION CIRCUIT

(71) Applicant: Chongqing GigaChip Technology Co., Ltd., Chongqing (CN)

(72) Inventors: Tao Liu, Chongqing (CN); Jianan Wang, Chongqing (CN); Minming Deng, Chongqing (CN); Xu Wang, Chongqing (CN); Lu Liu, Chongqing (CN); Dongbing Fu, Chongqing (CN); Zhengping Zhang, Chongqing (CN); Zhou Yu, Chongqing (CN); Guangbing Chen, Chongqing (CN); Xuemei Wu, Chongqing (CN); Xiaodan Zhou, Chongqing (CN)

(73) Assignee: Chongqing GigaChip Technology Co., Ltd., Chongqing (CN)

( * ) Notice: Subject to any disclaimer, the term of this patent is extended or adjusted under 35 U.S.C. 154(b) by 50 days.

(21) Appl. No.: 19/002,656

(22) Filed: Dec. 26, 2024

(65) Prior Publication Data

US 2025/0125796 A1 Apr. 17, 2025

Related U.S. Application Data

(63) Continuation of application No. PCT/CN2022/125048, filed on Oct. 13, 2022.

(30) Foreign Application Priority Data

Oct. 9, 2022 (CN) ........................ 202211228879.6

(51) Int. Cl.
*H03K 5/15* (2006.01)
*G06F 1/08* (2006.01)
(Continued)

(52) U.S. Cl.
CPC ............ *H03K 5/1506* (2013.01); *G06F 1/08* (2013.01); *H03K 3/84* (2013.01); *H03K 5/1534* (2013.01); *H03K 21/02* (2013.01); *H03K 19/21* (2013.01)

(58) Field of Classification Search
None
See application file for complete search history.

(56) References Cited

U.S. PATENT DOCUMENTS 5,177,786 A * 1/1993 Kang ................ H04N 21/2347 380/216
6,362,677 B1 * 3/2002 Petrofsky .............. G01R 19/22 327/348
7,587,439 B1 * 9/2009 Onufryk ................ G06F 7/588 708/250

* cited by examiner

*Primary Examiner* — Cassandra F Cox

(57) ABSTRACT

A low-jitter random clock generation circuit includes: a clock division and pulse generation module connected to an input clock, performing frequency division processing to obtain frequency division clocks, and then detecting some frequency division clocks one by one to obtain frequency division pulses in a one-to-one correspondence; a pseudo-random number generation module connected to one frequency division clock, and generating a pseudorandom number; a status control module connected to all the frequency division clocks and the pseudorandom number to generate status control signals; and a random clock output module connected to the input clock, all the frequency division clocks, all the frequency division pulses, and all the status control signals, randomly sampling the frequency division clocks by using the frequency division pulses under control of the status control signals, and synchronously outputting the randomly sampled frequency division clocks by using the input clock, to obtain random clocks.

10 Claims, 11 Drawing Sheets

(51) Int. Cl.

| | |
|---|---|
| ***H03K 3/84*** | (2006.01) |
| ***H03K 5/1534*** | (2006.01) |
| ***H03K 21/02*** | (2006.01) |
| *H03K 19/21* | (2006.01) |

LOW-JITTER RANDOM CLOCK GENERATION CIRCUIT

CROSS REFERENCE TO RELATED APPLICATION

The present application is a continuation application of PCT Application No. PCT/CN2022/125048, filed on Oct. 13, 2022, which claims the benefit of priority to a Chinese Patent Application number CN202211228879.6, filed on Oct. 9, 2022, the disclosure of the above application is hereby incorporated by reference in its entirety for all purposes.

TECHNICAL FIELD

The present disclosure relates to the field of integrated circuit technologies, and in particular, to a low-jitter random clock generation circuit.

BACKGROUND 5G millimeter wave and broadband communication require bandwidth of an analog-to-digital converter (ADC) to reach several GHz. This is equivalent to requiring a sampling rate of the ADC to reach several GSPS (Gigabit Samples Per Second) or even exceed 10 GSPS.

SUMMARY

One or more embodiments of the present disclosure provide a low-jitter random clock generation technical solution, so as to resolve a randomization problem of a high-speed and low-jitter sampling clock.

To achieve the foregoing objective and other related objectives, the present disclosure provides the following technical solutions.

A low-jitter random clock generation circuit includes:

- a clock division and pulse generation module, configured to: be connected to an input clock, perform frequency division processing on the input clock to obtain a plurality of frequency division clocks, and then detect some frequency division clocks one by one to obtain a plurality of frequency division pulses in a one-to-one correspondence;
- a pseudorandom number generation module, configured to: be connected to one frequency division clock, and generate a pseudorandom number based on the frequency division clock;
- a status control module, configured to: be connected to all the frequency division clocks and the pseudorandom number, and generate a plurality of status control signals based on the frequency division clocks and the pseudorandom number; and
- a random clock output module, configured to: be connected to the input clock, all the frequency division clocks, all the frequency division pulses, and all the status control signals, randomly sample the frequency division clocks by using the frequency division pulses under control of the status control signals, and synchronously output the randomly sampled frequency division clocks by using the input clock, to obtain random clocks.

In some embodiments of the present disclosure, the clock division and pulse generation module includes:

- a clock division unit, where an input terminal of the clock division unit is connected to the input clock, and the clock division unit performs frequency division processing on the input clock to obtain a plurality of frequency division clocks, and outputs the plurality of frequency division clocks one by one to the outside by using a plurality of output terminals of the clock division unit; and
- an edge detection unit, where input terminals of a plurality of edge detection units are connected to some of the plurality of output terminals of the clock division unit in a one-to-one correspondence, and the edge detection unit performs edge detection on the frequency division clock to obtain the frequency division pulse, and outputs the frequency division pulse to the outside by using an output terminal of the edge detection unit.

In some embodiments of the present disclosure, the edge detection unit includes a buffer and an XOR gate, an input terminal of the buffer serves as the input terminal of the edge detection unit, the input terminal of the buffer is connected to a first input terminal of the XOR gate, an output terminal of the buffer is connected to a second input terminal of the XOR gate, and an output terminal of the XOR gate serves as the output terminal of the edge detection unit.

In some embodiments of the present disclosure, the pseudorandom number includes a 1-bit pseudorandom sequence of any length.

In some embodiments of the present disclosure, the clock division and pulse generation module generates Q frequency division clocks, the status control module includes Q status control units, a first input terminal of a first status control unit is connected to a first output terminal of a $Q^{th}$ status control unit, a first input terminal of an $i^{th}$ status control unit is connected to a first output terminal of an $(i-1)^{th}$ status control unit, a second input terminal of a $j^{th}$ status control unit is connected to a $j^{th}$ frequency division clock, a third input terminal of the $j^{th}$ status control unit is connected to the pseudorandom number, a plurality of reset terminals/set terminals of the $j^{th}$ status control unit are connected to corresponding power-on reset/set signals one by one respectively, and a second output terminal of the $j^{th}$ status control unit outputs a $j^{th}$ status control signal, where Q is an integer greater than or equal to 2, i is an integer from 2 to Q, and j is an integer from 1 to Q.

In some embodiments of the present disclosure, the status control unit includes: M timing subunits, where first input terminals of the M timing subunits are connected and serve as the second input terminal of the status control unit, second input terminals of the M timing subunits are connected and serve as the third input terminal of the status control unit, a third input terminal of a $k^{th}$ timing subunit serves as a subport of the first input terminal of the status control unit, two reset terminals of the $k^{th}$ timing subunit are connected to corresponding power-on reset signals one by one, two set terminals of the $k^{th}$ timing subunit are connected to corresponding power-on set signals one by one respectively, and a second output terminal of the $k^{th}$ timing subunit serves as a subport of the first output terminal of the status control unit; and an encoder, where M input terminals of the encoder are connected to first output terminals of the M timing subunits in a one-to-one correspondence, an output terminal of the encoder serves as the second output terminal of the status control unit, and the output terminal of the encoder includes Q+1 parallel subports, where M is an integer greater than or equal to 2, k is an integer from 1 to M, and $2^M \geq Q+1$.

In some embodiments of the present disclosure, the timing subunit includes a first data selector, a second data selector, a first D flip-flop, and a second D flip-flop; an address input terminal of the first data selector and an address input terminal of the second data selector are connected and serve as the second input terminal of the timing subunit; a second data input terminal of the first data selector and a first data input terminal of the second data selector are connected and serve as the third input terminal of the timing subunit; a data output terminal of the first data selector is connected to a data input terminal of the first D flip-flop, a set terminal of the first D flip-flop serves as a first set terminal of the timing subunit, a reset terminal of the first D flip-flop serves as a first reset terminal of the timing subunit, a data output positive terminal of the first D flip-flop is connected to both a first data input terminal of the first data selector and a second data input terminal of the second data selector, and the data output positive terminal of the first D flip-flop serves as the first output terminal of the timing subunit; a data output terminal of the second data selector is connected to a data input terminal of the second D flip-flop, a set terminal of the second D flip-flop serves as a second set terminal of the timing subunit, a reset terminal of the second D flip-flop serves as a second reset terminal of the timing subunit, and a data output positive terminal of the second D flip-flop serves as the second output terminal of the timing subunit; and a clock input terminal of the first D flip-flop and a clock input terminal of the second D flip-flop are connected and serve as the first input terminal of the timing subunit.

In some embodiments of the present disclosure, the random clock output module includes Q+1 clock random distributors disposed in parallel, a first input terminal of an $m^{th}$ clock random distributor is connected to the input clock, Q second input terminals of the $m^{th}$ clock random distributor are connected to the Q frequency division clocks in a one-to-one correspondence, Q third input terminals of the $m^{th}$ clock random distributor are correspondingly connected to all the frequency division pulses, with one frequency division pulse being separately connected to two third input terminals, Q fourth input terminals of the $m^{th}$ clock random distributor are connected to the Q status control signals in a one-to-one correspondence, and an output terminal of the $m^{th}$ clock random distributor outputs an $m^{th}$ random clock; and the random clock output module generates and outputs Q+1 random clocks, phases of the Q+1 random clocks are different from each other, and a relative phase relationship of the Q+1 random clocks varies with the pseudorandom number, where m is an integer from 1 to Q+1.

In some embodiments of the present disclosure, the clock random distributor includes a third data selector, a fourth data selector, a third D flip-flop, and a fourth D flip-flop; Q address input terminals of the third data selector and Q address input terminals of the fourth data selector are connected and serve as the Q fourth input terminals of the clock random distributor; Q data input terminals of the third data selector serve as the Q second input terminals of the clock random distributor, and a data output terminal of the third data selector is connected to a data input terminal of the third D flip-flop; and Q data input terminals of the fourth data selector serve as the Q third input terminals of the clock random distributor, a data output terminal of the fourth data selector is connected to a clock input terminal of the third D flip-flop, a data output positive terminal of the third D flip-flop is connected to a data input terminal of the fourth D flip-flop, a clock input terminal of the fourth D flip-flop serves as the first input terminal of the clock random distributor, and a data output positive terminal of the fourth D flip-flop serves as the output terminal of the clock random distributor.

In some embodiments of the present disclosure, Q is an even number, phases of the Q frequency division clocks are different from each other, and Q/2 frequency division clocks are phase-inverted with respect to the other Q/2 frequency division clocks in a one-to-one correspondence.

DESCRIPTION OF EMBODIMENTS

Figure 1:
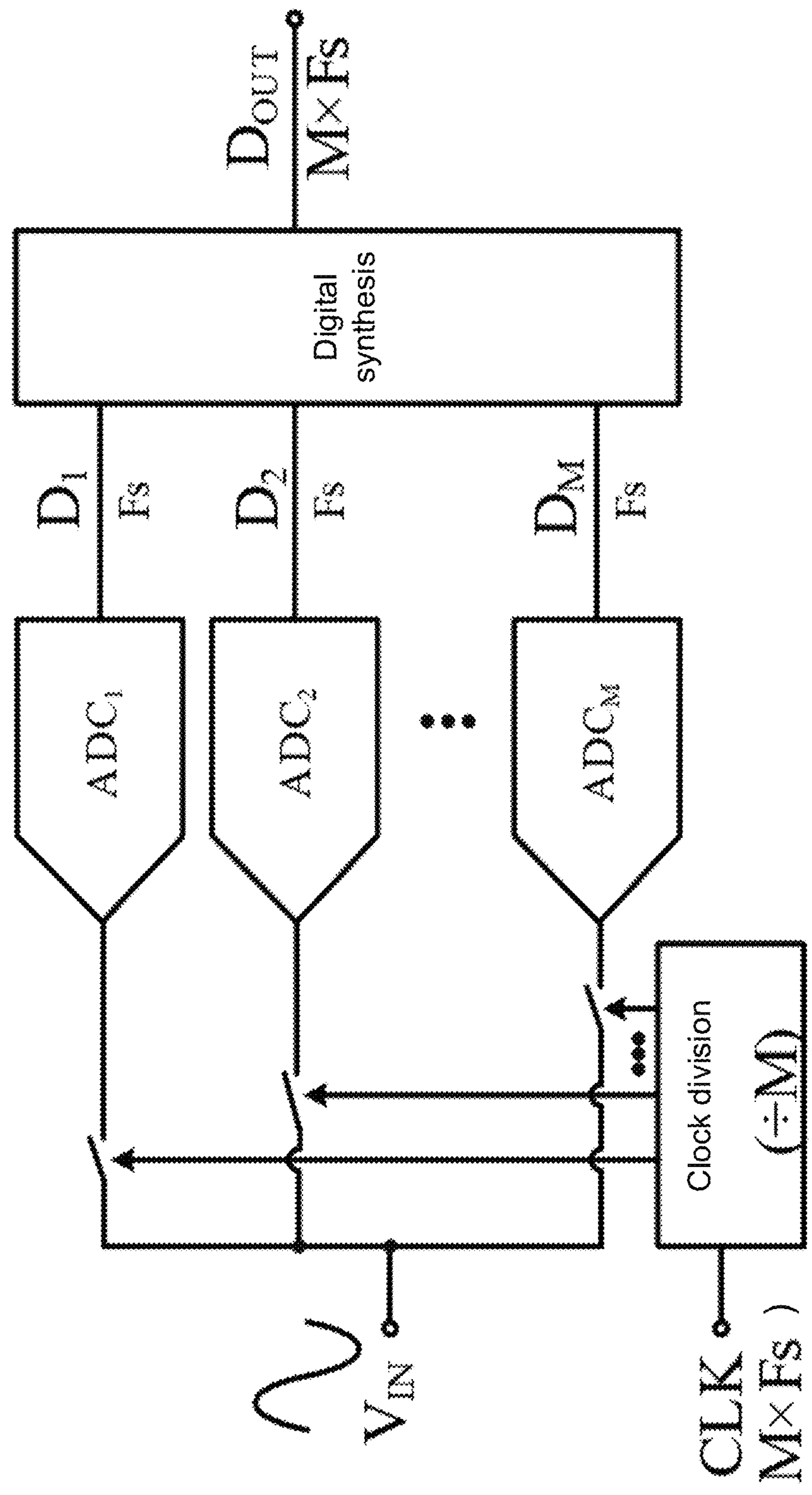
FIG. 1 is a schematic structural diagram of a time-interleaved analog-to-digital converter in the conventional technology.

The following describes implementations of the present disclosure by using some specific examples. A person skilled in the art can easily understand other advantages and effects of the present disclosure based on the content disclosed in this specification. The present disclosure may be further implemented or applied by using other different specific implementations. Various details in this specification may also be modified or altered based on different viewpoints and applications without departing from the present disclosure.

Due to a limitation of a device characteristic frequency, a sampling rate of a conventional single-channel analog-to-digital converter is always limited to some extent. A technical approach to resolve this problem is a time-interleaved analog-to-digital converter. For the time-interleaved analog-to-digital converter, an advantage is that a conversion rate of the analog-to-digital converter is increased, and a disadvantage is that the time-interleaved analog-to-digital converter generates spurious signals related to a clock and an analog input signal. A digital algorithm and a foreground trimming method are usually used to suppress these spurious components. These methods can minimize an amplitude of the spurious components, but cannot completely eliminate the spurious components. An effective method to thoroughly resolve this problem is to randomize sampling times of a plurality of analog-to-digital converters, and convert the spurious components into white noise, to improve linearity of the analog-to-digital converters. However, a difficulty in this method lies in randomization and low jitter of a high-speed clock.

Refer to FIG. 1 to FIG. 13. It should be noted that the drawings provided in the embodiments merely describe the basic concept of the present disclosure by using examples. Although the drawings show only components related to the present disclosure, and are not drawn based on a quantity of components, a shape of a component, and a size of a component during actual implementation, a shape, a quantity, and a scale of the components may be arbitrarily changed during actual implementation, and a component layout form may be more complex. The structure, scale, size, and the like shown in the drawings of this specification are merely used to cooperate with the content disclosed in this specification for a person skilled in the art to understand and read, and are not restrictions for limiting implementation of the present disclosure, and therefore have no technically substantial significance. Any modification of the structure, change of a proportional relationship, or adjustment of the size shall still fall within the scope that can be covered by the technical content disclosed in the present disclosure, provided that they do not affect the efficacy that can be generated by the present disclosure and the purpose that can be achieved by the present disclosure.

As described above, the inventor finds, through research, that a time-interleaved analog-to-digital converter proposed to resolve a limitation on a sampling rate of a conventional single-channel analog-to-digital converter includes a clock divider, a digital synthesizer, and M (M is an integer greater than or equal to 2) analog-to-digital converters, namely, $ADC_1$, $ADC_2$, . . . , and $ADC_M$, disposed in parallel, as shown in FIG. 1. An analog input signal of the M analog-to-digital converters disposed in parallel is $V_{IN}$, and an input clock of the clock divider is CLK=M×Fs. The clock divider performs M-time frequency division processing on the input clock CLK to obtain frequency division clocks Fs. The clock divider provides a clock for each analog-to-digital converter. A working rate of each analog-to-digital converter is Fs, and a working rate in a case of time interleaving of the M analog-to-digital converters is M×Fs. Outputs of the M analog-to-digital converters disposed in parallel are $D_1$, $D_2$, . . . , and $D_M$, and are synthesized by the digital synthesizer to obtain a digital output $D_{OUT}$. For the time-interleaved analog-to-digital converter, an advantage is that a conversion rate is increased, and a disadvantage is that spurious signals k×fs/M±fin (K=1, . . . , and M−1) related to the input clock and the analog input signal are generated. A digital algorithm and a foreground trimming method usually need to be used to suppress these spurious signals. These methods can minimize an amplitude of spurious signal components, but cannot completely eliminate the spurious signal components. An effective method to thoroughly resolve this problem is to randomize sampling times of the M analog-to-digital converters and convert the spurious components into white noise, to improve linearity of the analog-to-digital converters. However, a difficulty in this method lies in randomization and low jitter of a high-speed clock.

Based on this, the present disclosure provides a low-jitter random clock generation technical solution: A low-jitter random clock generation circuit is designed based on a structure of "clock division and pulse generation module+pseudorandom number generation module+status control module+random clock output module". Based on a pseudorandom number generated by the pseudorandom number generation module, a status control signal whose status varies with the pseudorandom number is generated in the status control module. In the random clock output module, a frequency division clock is randomly sampled by using a frequency division pulse under control of the status control signal varying with the pseudorandom number, and the randomly sampled frequency division clock is synchronously output by using an input clock, to obtain a random clock. The two consecutive clock signals are a relatively high-speed frequency division pulse and an input clock serving as a master clock, to stabilize a duty cycle and reduce jitter. An overall modular structure is designed, and a fully digital structure can be used, to reduce static power consumption and increase a speed. In addition, each module can be designed based on a conventional logic device, and is compatible with various existing mature processes to improve applicability.

Figure 2:
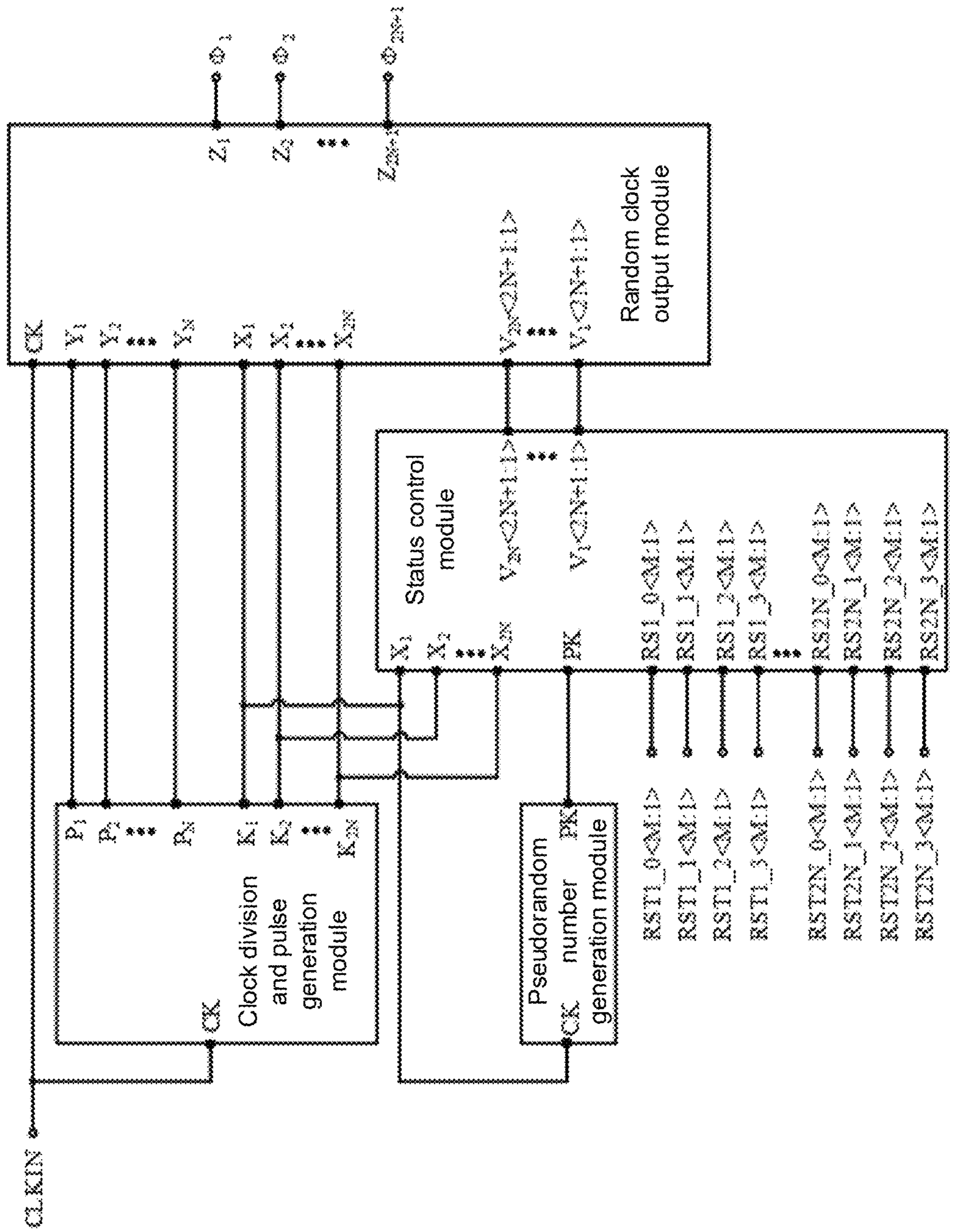
FIG. 2 is a structural block diagram of a low-jitter random clock generation circuit according to an embodiment of the present disclosure.

One or more embodiments of the present disclosure provide a low-jitter random clock generation circuit. As shown in FIG. 2, the low-jitter random clock generation circuit includes at least:

a clock division and pulse generation module, configured to: be connected to an input clock CLKIN, perform frequency division processing on the input clock CLKIN to obtain a plurality of frequency division clocks, namely, frequency division clocks $K_1$, $K_2$, . . . , and $K_{2N}$, and then detect some of the plurality of frequency division clocks one by one to obtain a plurality of frequency division pulses in a one-to-one correspondence, namely, frequency division pulses $P_1$, $P_2$, . . . , and $P_N$;

a pseudorandom number generation module, configured to: be connected to the frequency division clock $K_1$, and generate a pseudorandom number PK based on the frequency division clock $K_1$;

a status control module, configured to: be connected to all the frequency division clocks $K_1$, $K_2$, . . . , and $K_2N$ and the pseudorandom number PK, and generate a plurality of status control signals, namely, status control signals $V_1<2N+1:1>$, $V_2<2N+1:1>$, . . . , $V_{2N-1}<2N+1:1>$, and $V_{2N}<2N+1:1>$, based on the frequency division clocks $K_1$, $K_2$, . . . , and $K_{2N}$ and the pseudorandom number PK; and a random clock output module, configured to: be connected to the input clock CLKIN, all the frequency division clocks (namely, the frequency division clocks $K_1$, $K_2$, . . . , and $K_{2N}$), all the frequency division pulses (namely, the frequency division pulses $P_1$, $P_2$, . . . , and $P_N$), and all the status control signals (namely, the status control signals $V_1<2N+1:1>$, $V_2<2N+1:1>$, . . . , $V_{2N-1}<2N+1:1>$, and $V_{2N}<2N+1:1>$), randomly sample the frequency division clocks $K_1$, $K_2$, . . . , and $K_{2N}$ by using the frequency division pulses $P_1$, $P_2$, . . . , and $P_N$ under control of the status control signals $V_1<2N+1:1>$, $V_2<2N+1:1>$, . . . , $V_{2N-1}<2N+1:1>$, and $V_2N<2N+1:1>$, and synchronously output the randomly sampled frequency division clocks $K_1$, $K_2$, . . . , and $K_2N$ by using the input clock CLKIN, to obtain random clocks $\Phi_1$, $\Phi_2$, . . . , and $\Phi_{2N+1}$.

Figure 3:
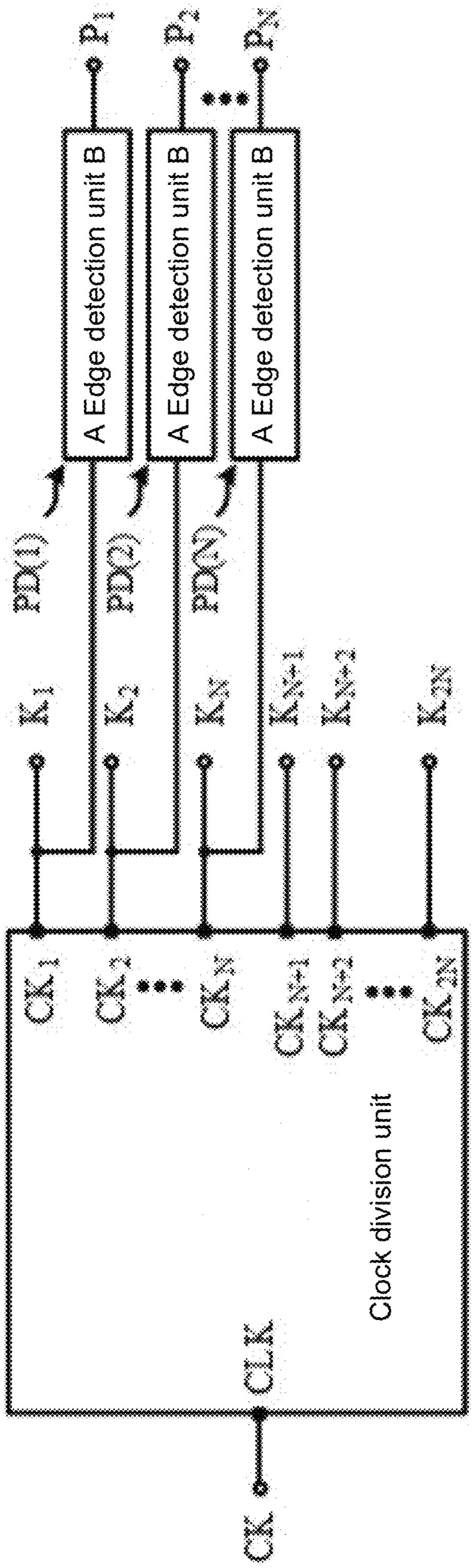
FIG. 3 is a structural block diagram of a clock division and pulse generation module in FIG. 2.

As shown in FIG. 3, in an optional embodiment of the present disclosure, the clock division and pulse generation module includes:

a clock division unit, where an input terminal CK of the clock division unit is connected to the input clock CLKIN, and the clock division unit performs frequency division processing on the input clock CLKIN to obtain a plurality of frequency division clocks, and outputs the plurality of frequency division clocks one by one to the outside by using a plurality of output terminals of the clock division unit respectively, that is, outputs the frequency division clock $K_1$ at an output terminal $CK_1$, outputs the frequency division clock $K_2$ at an output terminal $CK_2$, outputs the frequency division clock $K_N$ at an output terminal $CK_N$, outputs the frequency division clock $K_{N+1}$ at an output terminal $CK_{N+1}$, outputs the frequency division clock $K_{N+2}$ at an output terminal $CK_{N+2}$, . . . , and outputs the frequency division clock $K_{2N}$ at an output terminal $CK_{2N}$; and an edge detection unit, where a plurality of edge detection units are disposed in parallel, input terminals of the plurality of edge detection units are connected to some of the plurality of output terminals of the clock division unit in a one-to-one correspondence, and the edge detection unit performs edge detection on the frequency division clock to obtain the frequency division pulse, and outputs the frequency division pulse to the outside by using an output terminal of the edge detection unit, that is, an input terminal A of an edge detection unit PD(1) is connected to the output terminal $CK_1$ of the clock division unit, and the edge detection unit PD(1) performs edge detection on the frequency division clock $K_1$ to obtain the frequency division pulse $P_1$, and outputs the frequency division pulse $P_1$ at an output terminal B of the edge detection unit PD(1), an input terminal A of an edge detection unit PD(2) is connected to the output terminal $CK_2$ of the clock division unit, and the edge detection unit PD(2) performs edge detection on the frequency division clock $K_2$ to obtain the frequency division pulse $P_2$, and outputs the frequency division pulse $P_2$ at an output terminal B of the edge detection unit PD(2), . . . , and an input terminal A of an edge detection unit PD(N) is connected to the output terminal $CK_N$ of the clock division unit, and the edge detection unit PD(N) performs edge detection on the frequency division clock $K_N$ to obtain the frequency division pulse $P_N$, and outputs the frequency division pulse $P_N$ at a terminal B of the edge detection unit PD(N).

In an embodiment, as shown in FIG. 2 and FIG. 3, the clock division unit performs 2N-time frequency division processing on the input clock CLKIN, to generate 2N frequency division clocks, namely, the frequency division clocks $K_1$, $K_2$, . . . , and $K_{2N}$, frequency of each of the 2N frequency division clocks is ½N of a frequency of the input clock CLKIN, where N is a natural number. It should be noted that a clock division ratio of the clock division unit is not necessarily an even number 2N, or may be an odd number 2N+1. This is not limited herein. The clock division unit may be of a common clock division structure.

Figure 4:
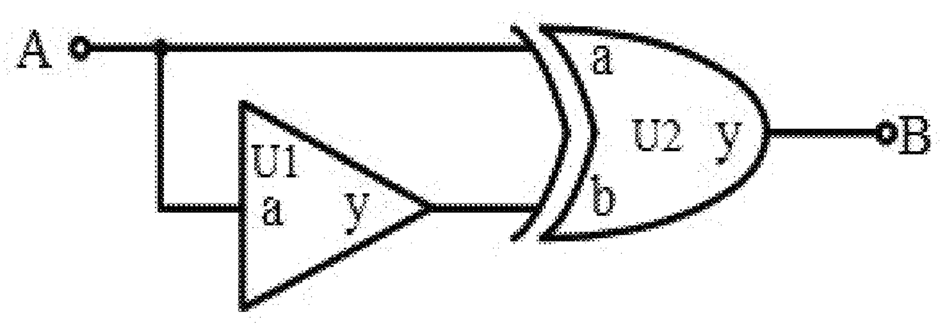
FIG. 4 is a circuit diagram of an edge detection unit in FIG. 3.

In an embodiment, as shown in FIG. 4, the edge detection unit includes a buffer U1 and an XOR gate U2. An input terminal a of the buffer U1 serves as the input terminal A of the edge detection unit, the input terminal a of the buffer U1 is connected to a first input terminal a of the XOR gate U2, an output terminal y of the buffer U1 is connected to a second input terminal b of the XOR gate U2, and an output terminal y of the XOR gate U2 serves as the output terminal B of the edge detection unit. The edge detection unit is configured to detect a rising edge and a falling edge of the frequency division clock, and separately outputs a pulse, namely, a frequency division pulse, on the rising edge and the falling edge.

In an embodiment, as shown in FIG. 2, the pseudorandom number generation module may be a common pseudorandom number generator, and an input terminal CK of the pseudorandom number generation module is connected to the frequency division clock $K_1$. The pseudorandom number generation module generates the pseudorandom number PK based on the frequency division clock $K_1$, and the generated pseudorandom number PK includes a 1-digit pseudorandom sequence of any length.

In an embodiment, the clock division and pulse generation module generates Q frequency division clocks, the status control module includes Q status control units, a first input terminal of a first status control unit is connected to a first output terminal of a $Q^{th}$ status control unit, a first input terminal of an $i^{th}$ status control unit is connected to a first output terminal of an $(i-1)^{th}$ status control unit, a second input terminal of a $j^{th}$ status control unit is connected to a $j^{th}$ frequency division clock, a third input terminal of the $j^{th}$ status control unit is connected to the pseudorandom number, a plurality of reset terminals/set terminals of the $j^{th}$ status control unit are connected to corresponding power-on reset/set signals one by one respectively, and a second output terminal of the $j^{th}$ status control unit outputs a $j^{th}$ status control signal, where Q is an integer greater than or equal to 2, i is an integer from 2 to Q, and j is an integer from 1 to Q.

Figure 5:
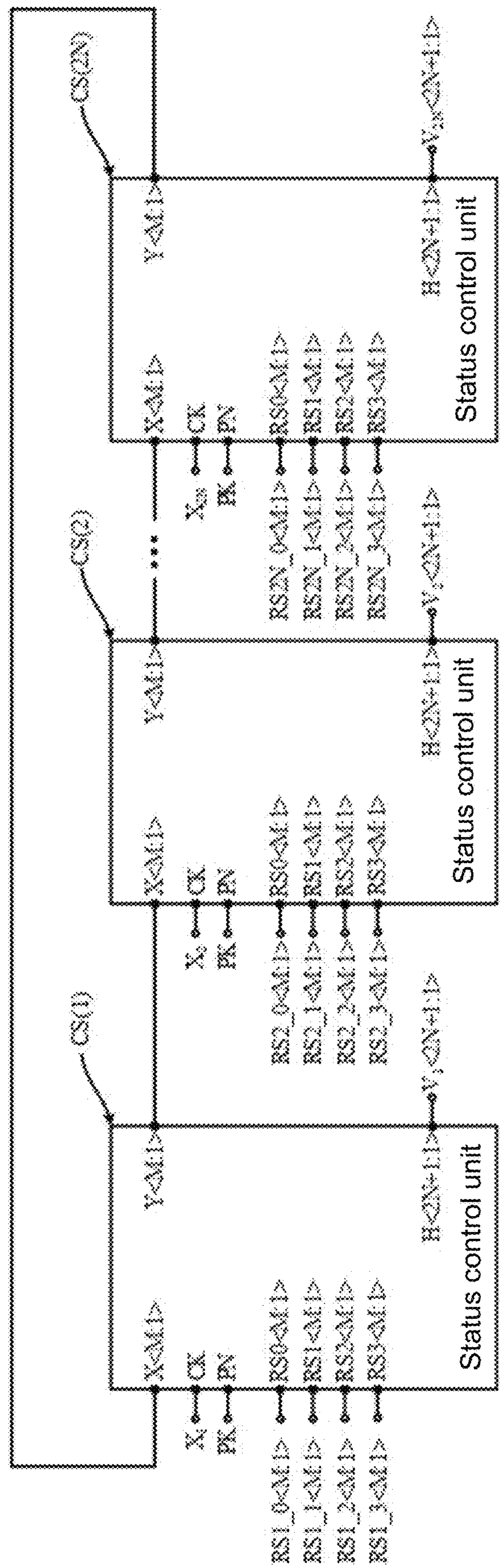
FIG. 5 is a structural block diagram of a status control module in FIG. 2.

In an optional embodiment of the present disclosure, as shown in FIG. 5, Q is an even number 2N, and the status control module includes 2N status control units, namely, status control units CS(1), CS(2), . . . , and CS(2N); and the status control units generate the status control signals $V_1$<2N+1:1>, $V_2$<2N+1:1>, . . . , $V_{2N-1}$<2N+1:1>, and $V_{2N}$<2N+1:1> based on the frequency division clocks $K_1$, $K_2$, . . . , and $K_{2N}$ and the pseudorandom number PK.

In an embodiment, as shown in FIG. 5, a first input terminal X<M:1> of the status control unit CS(1) is connected to a first output terminal Y<M:1> of the status control unit CS(2N) in a one-to-one correspondence, a second input terminal CK of the status control unit CS(1) is connected to the frequency division clock $K_1$ through a port $X_1$, a third input terminal PN of the status control unit CS(1) is connected to the pseudorandom number PK, an input terminal RS0<M:1> (serving as a reset terminal/set terminal) of the status control unit CS(1) is connected to a power-on reset/set signal RS1_0<M:1> in a one-to-one correspondence, an input terminal RS1<M:1> (serving as a reset terminal/set terminal) of the status control unit CS(1) is connected to a power-on reset/set signal RS1_1<M:1> in a one-to-one correspondence, an input terminal RS2<M:1> (serving as a reset terminal/set terminal) of the status control unit CS(1) is connected to a power-on reset/set signal RS1_2<M:1> in a one-to-one correspondence, an input terminal RS3<M:1> of the status control unit CS(1) is connected to a power-on reset/set signal RS1_3<M:1> in a one-to-one correspondence, and a second output terminal H<2N+1:1> of the status control unit CS(1) outputs the status control signal $V_1$<2N+1:1> in a one-to-one correspondence.

A first input terminal X<M:1> of the status control unit CS(2) is connected to a first output terminal Y<M:1> of the status control unit CS(1) in a one-to-one correspondence, a second input terminal CK of the status control unit CS(2) is connected to the frequency division clock $K_2$ through a port $X_2$, a third input terminal PN of the status control unit CS(2) is connected to the pseudorandom number PK, an input terminal RS0<M:1> (serving as a reset terminal/set terminal) of the status control unit CS(2) is connected to a power-on reset/set signal RS2_0<M:1> in a one-to-one correspondence, an input terminal RS1<M:1> (serving as a reset terminal/set terminal) of the status control unit CS(2) is connected to a power-on reset/set signal RS2_1<M:1> in a one-to-one correspondence, an input terminal RS2<M:1> (serving as a reset terminal/set terminal) of the status control unit CS(2) is connected to a power-on reset/set signal RS2_2<M:1> in a one-to-one correspondence, an input terminal RS3<M:1> of the status control unit CS(2) is connected to a power-on reset/set signal RS2_3<M:1> in a one-to-one correspondence, and a second output terminal H<2N+1:1> of the status control unit CS(2) outputs the status control signal $V_2$<2N+1:1> in a one-to-one correspondence.

A similar case can be obtained by analogy.

A first input terminal X<M:1> of the status control unit CS(2N) is connected to a first output terminal Y<M:1> of the status control unit CS(2N−1) in a one-to-one correspondence, a second input terminal CK of the status control unit CS(2N) is connected to the frequency division clock $K_{2N}$ through a port $X_{2N}$, a third input terminal PN of the status control unit CS(2N) is connected to the pseudorandom number PK, an input terminal RS0<M:1> (serving as a reset terminal/set terminal) of the status control unit CS(2N) is connected to a power-on reset/set signal RS2N_0<M:1> in a one-to-one correspondence, an input terminal RS1<M:1> (serving as a reset terminal/set terminal) of the status control unit CS(2N) is connected to a power-on reset/set signal RS2N_1<M:1> in a one-to-one correspondence, an input terminal RS2<M:1> (serving as a reset terminal/set terminal) of the status control unit CS(2N) is connected to a power-on reset/set signal RS2N_2<M:1> in a one-to-one correspondence, an input terminal RS3<M:1> of the status control unit CS(2N) is connected to a power-on reset/set signal RS2N_3<M:1> in a one-to-one correspondence, and a second output terminal H<2N+1:1> of the status control unit CS(2N) outputs the status control signal $V_2$N<2N+1:1> in a one-to-one correspondence.

Herein, M is an integer greater than or equal to 2.

Figure 6:
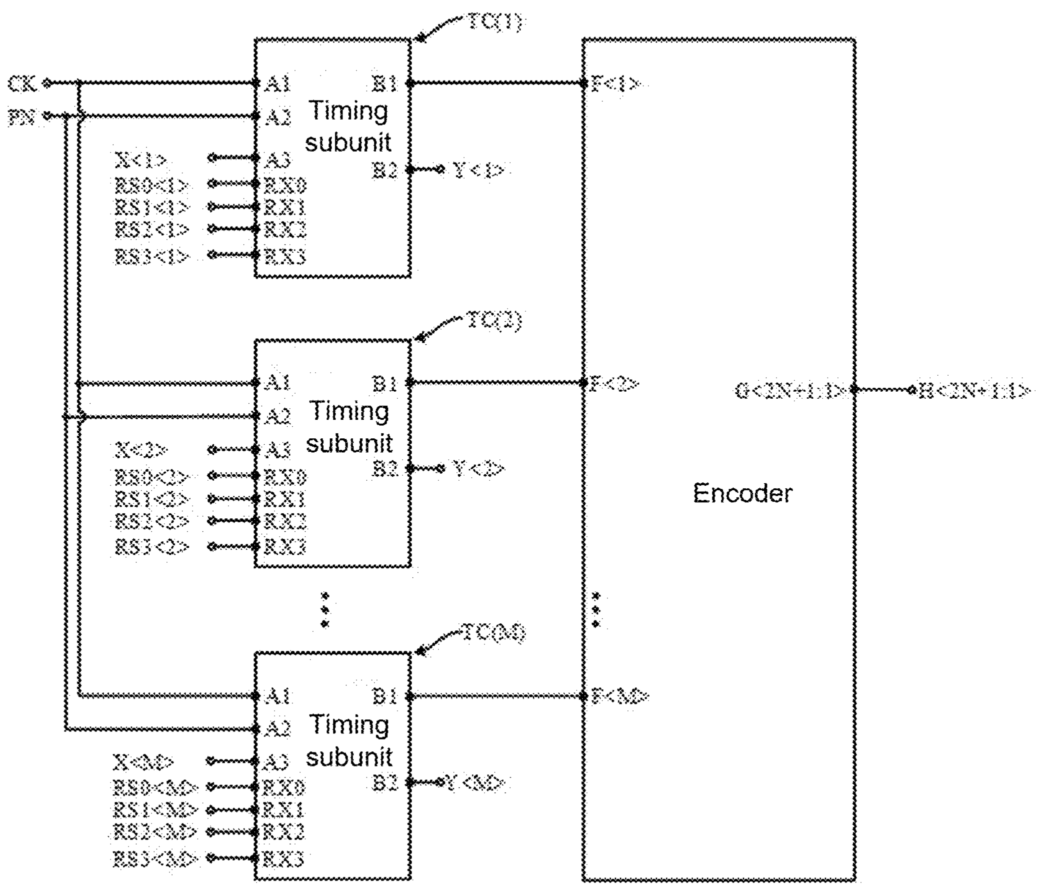
FIG. 6 is a structural block diagram of a status control unit in FIG. 5.

In an embodiment, as shown in FIG. 6, the status control unit further includes:

M timing subunits, namely, timing subunits TC(1), TC(2), . . . , and TC(M), where first input terminals A1 of the M timing subunits are connected and serve as the second input terminal CK of the status control unit, second input terminals A2 of the M timing subunits are connected and serve as the third input terminal PN of the status control unit, a third input terminal A3 of a $k^{th}$ timing subunit serves as a subport X<k> of the first input terminal X<M:1> of the status control unit, two reset terminals RX0 and RX2 of the $k^{th}$ timing subunit are connected to corresponding power-on reset signals RS0<k> and RS2<k> one by one, two set terminals RX1 and RX3 of the $k^{th}$ timing subunit are connected to corresponding power-on set signals RS1<k> and RS3<k> one by one, and a second output terminal B2 of the $k^{th}$ timing subunit serves as a subport X<k> of the first output terminal Y<M:1> of the status control unit; and an encoder, where M input terminals of the encoder are connected to first output terminals B1 of the M timing subunits in a one-to-one correspondence, that is, an input terminal F<1> is connected to a first output terminal B1 of the timing subunit TC(1), an input terminal F<2> is connected to a first output terminal B1 of the timing subunit TC(2), . . . , and an input terminal F<M> is connected to a first output terminal B1 of the timing subunit TC (M), an output terminal G<2N+1:1> of the encoder serves as the second output terminal H<2N+1:1> of the status control unit, and the output terminal G<2N+1:1> of the encoder includes 2N+1 parallel subports, namely, G<2N+1>, G<2N>, . . . , G<2>, and G<1>.

Herein, k is an integer from 1 to M, and 2M≥2N+1.

It should be noted that the M timing subunits function to store and update control statuses based on a change of the pseudorandom number PK (equivalent to status registers). The encoder is configured to encode outputs of the M timing subunits, so as to generate corresponding status control signals for the random clock output module. The encoder may be an encoder of any structure.

Figure 7:
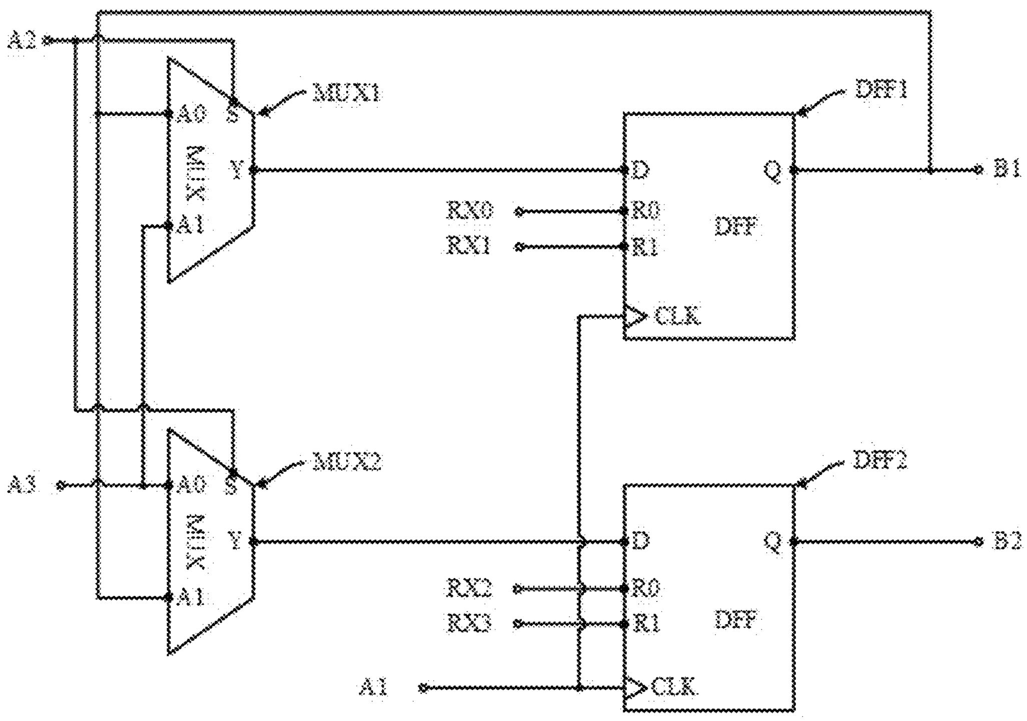
FIG. 7 is a circuit diagram of a timing subunit in FIG. 6.

In an embodiment, as shown in FIG. 7, the timing subunit further includes a first data selector MUX1, a second data selector MUX2, a first D flip-flop DFF1, and a second D flip-flop DFF2; an address input terminal S of the first data selector MUX1 and an address input terminal S of the second data selector MUX2 are connected and serve as the second input terminal A2 of the timing subunit; a second data input terminal A1 of the first data selector MUX1 and a first data input terminal A0 of the second data selector MUX2 are connected and serve as the third input terminal A3 of the timing subunit; a data output terminal Y of the first data selector MUX1 is connected to a data input terminal D of the first D flip-flop DFF1, a set terminal R0 of the first D flip-flop DFF1 serves as a first set terminal RX0 of the timing subunit, a reset terminal R1 of the first D flip-flop DFF1 serves as a first reset terminal RX1 of the timing subunit, a data output positive terminal Q of the first D flip-flop DFF1 is connected to both a first data input terminal A0 of the first data selector MUX1 and a second data input terminal A1 of the second data selector MUX2, and the data output positive terminal Q of the first D flip-flop DFF1 serves as the first output terminal B1 of the timing subunit; a data output terminal Y of the second data selector MUX2 is connected to a data input terminal D of the second D flip-flop DFF2, a set terminal R0 of the second D flip-flop DFF2 serves as a second set terminal RX2 of the timing subunit, a reset terminal R1 of the second D flip-flop DFF2 serves as a second reset terminal RX3 of the timing subunit, and a data output positive terminal Q of the second D flip-flop DFF2 serves as the second output terminal B2 of the timing subunit; and clock input terminal CLK of the first D flip-flop DFF1 and a clock input terminal CLK of the second D flip-flop DFF2 are connected and serve as the first input terminal A1 of the timing subunit.

In an embodiment, the random clock output module includes Q+1 clock random distributors disposed in parallel. Each clock random distributor outputs one random clock. Phases of Q+1 random clocks generated and output by the random clock output module are different from each other, and a relative phase relationship of the Q+1 random clocks varies with the pseudorandom number PK.

Figure 8:
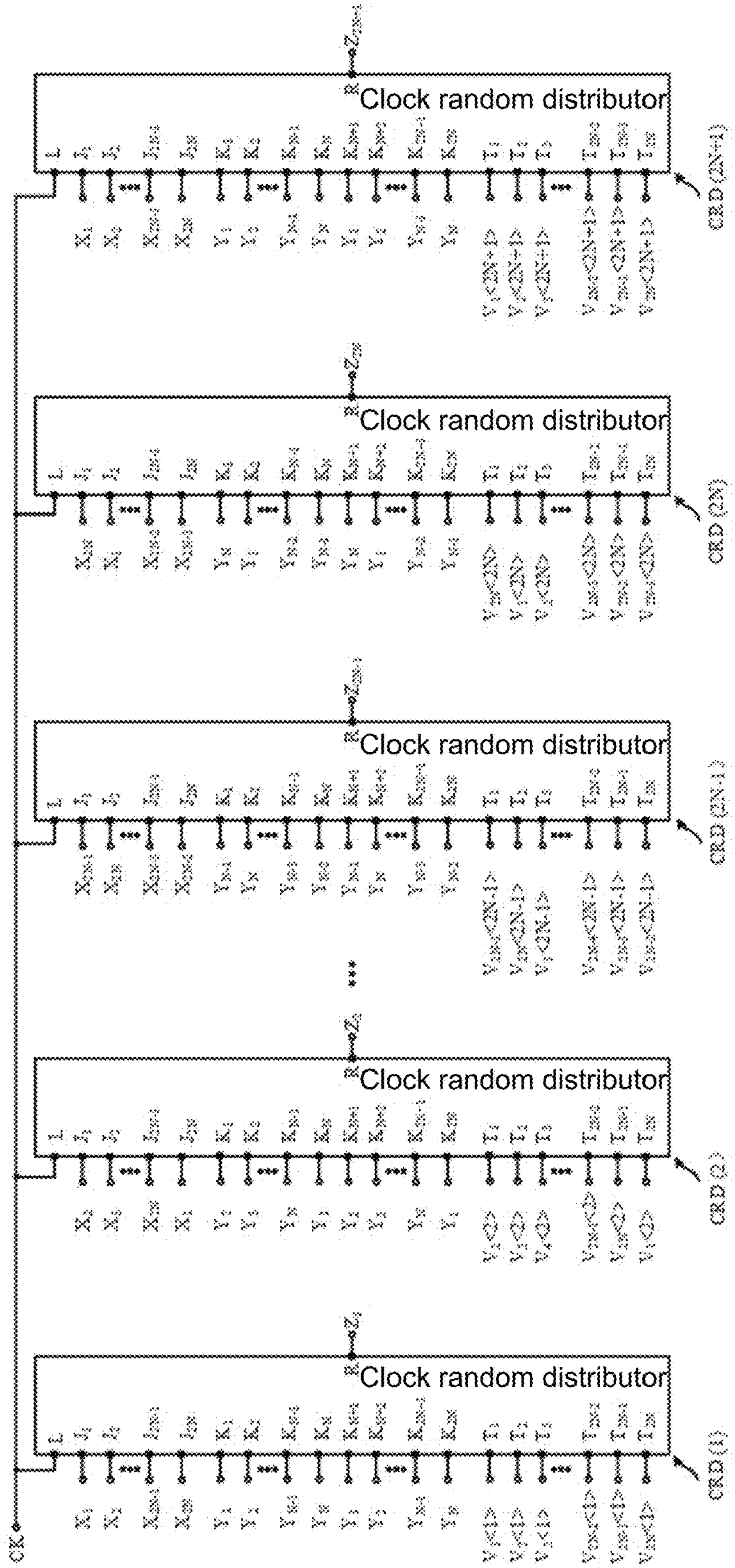
FIG. 8 is a structural block diagram of a random clock output module in FIG. 2.

In an optional embodiment of the present disclosure, as shown in FIG. 8, Q is an even number 2N, and the random clock output module includes 2N+1 clock random distributors, namely, clock random distributors CRD(1), CRD(2), . . . , CRD(2N−1), CRD(2N), and CRD(2N+1), disposed in parallel. A first input terminal L of an $m^{th}$ clock random distributor CRD(m) is connected to the input clock CLKIN through a port CK, 2N second input terminals of the $m^{th}$ clock random distributor CRD(m) are connected to the 2N frequency division clocks in a one-to-one correspondence, that is, second input terminals $J_1, J_2, \ldots, J_{2N-1}$, and $J_{2N}$ are connected to the frequency division clocks $K_1, K_2, \ldots, K_{2N-1}$, and $K_{2N}$ in a one-to-one correspondence through ports $X_1$, $X_2$, . . . , $X_{2N-1}$, and $X_{2N}$, 2N third input terminals of the $m^{th}$ clock random distributor CRD(m) are correspondingly connected to all the frequency division pulses, that is, third input terminals $K_1$, $K_2$, . . . , $K_{2N-1}$, and $K_{2N}$ are correspondingly connected to the frequency division pulses $P_1$, $P_2$, . . . , $P_{N-1}$, and $P_N$ through ports $Y_1$, $Y_2$, . . . , $Y_{N-1}$, and $Y_N$, with one frequency division pulse being separately connected to two third input terminals, 2N fourth input terminals of the $m^{th}$ clock random distributor CRD(m) are connected to the 2N status control signals in a one-to-one correspondence, that is, fourth input terminals $T_1$, $T_2$, . . . , $T_{2N-1}$, and $T_{2N}$ are connected to status control signals $V_1$<m>, $V_2$<m>, . . . , $V_{2N-1}$<m>, and $V_{2N}$<m> in a one-to-one correspondence, and an output terminal R of the $m^{th}$ clock random distributor CRD (m) outputs an $m^{th}$ random clock Φm through a port $Z_m$, where m is an integer from 1 to 2N+1. In addition, third input terminals, fourth input terminals, and fifth input terminals of the parallel 2N+1 clock random distributors sequentially roll. For example, as shown in FIG. 8, the ports $X_1$, $X_2$, . . . , $X_{2N-1}$, and $X_{2N}$ rolling in the sequence of ($X_1$, $X_2$, . . . , $X_{2N-1}$, $X_{2N}$), ($X_2$, $X_3$, . . . , $X_{2N-1}$, $X_{2N}$, $X_1$), . . . , ($X_{2N}$, $X_1$, $X_2$, $X_3$, . . . . $X_{2N-1}$) to be respectively connected to the second input terminals $J_1$, $J_2$, . . . , $J_{2N-1}$, and $J_{2N}$ of the clock random distributors CRD(1), CRD(2), . . . , CRD(2N−1), CRD(2N), and CRD(2N+1). The ports Xi<i=1, . . . , 2N> rolling in the sequence to be as inputs J of the clock random distributors CRD(j)<j=1, . . . , 2N+1>. The ports Yi<i=1, . . . , N> rolling in the sequence to be as inputs K of the clock random distributors CRD(j)<j=1, . . . , 2N+1>. And the ports Vi<j><i=1, . . . , 2N> rolling in the sequence to be as inputs T of the clock random distributors CRD(j)<j=1, . . . , 2N+1>.

In an embodiment, as shown in FIG. 8, for a first clock random distributor CRD(1), a first input terminal L is connected to the input clock CLKIN through the port CK; a second input terminal $J_1$ is connected to the frequency division clock $K_1$ through a port $X_1$, a second input terminal $J_2$ is connected to the frequency division clock $K_2$ through a port $X_2$, and by analogy, a second input terminal $J_{2N}$ is connected to the frequency division clock $K_{2N}$ through a port $X_{2N}$; a third input terminal $K_1$ is connected to the frequency division pulse $P_1$ through a port $Y_1$, a third input terminal $K_2$ is connected to the frequency division pulse $P_2$ through a port $Y_2$, and by analogy, a third input terminal $K_N$ is connected to the frequency division pulse PN through a port $Y_N$; a third input terminal $K_{N+1}$ is connected to the frequency division pulse $P_1$ through the port $Y_1$, a third input terminal $K_{N+2}$ is connected to the frequency division pulse $P_2$ through the port $Y_2$, and by analogy, a third input terminal $K_{2N}$ is connected to the frequency division pulse $P_N$ through the port $Y_N$; a fourth input terminal $T_1$ is connected to a status control signal $V_1$<1>, a fourth input terminal $T_2$ is connected to a status control signal $V_2$<1>, and by analogy, a fourth input terminal $T_{2N}$ is connected to a status control signal $V_{2N}$<1>; and an output terminal R outputs a first random clock $\angle_1$ through a port $Z_1$.

For an $n^{th}$ clock random distributor CRD(n), where 2N≥n≥2, a first input terminal L is connected to the input clock CLKIN through the port CK; a second input terminal $J_1$ is connected to the frequency division clock $K_n$ through a port $X_n$, a second input terminal $J_2$ is connected to the frequency division clock $K_{[n+1]mod2N}$ through a port $X_{[n+1]mod2N}$, and by analogy, a second input terminal $J_{2N}$ is connected to the frequency division clock $K_{n-1}$ through a port $X_{n-1}$; a third input terminal $K_1$ is connected to the frequency division pulse $P_{n-N}$ through a port $Y_{n-N}$, a third input terminal $K_2$ is connected to the frequency division pulse $P_{[n+1]modN}$ through a port $Y_{[n+1]modN}$, and by analogy, a third input terminal $K_N$ is connected to the frequency division pulse $P_{n-1}$ through a port $Y_{n-1}$; a third input terminal $K_{N+1}$ is connected to the frequency division pulse $P_n$ through a port $Y_n$, a third input terminal $K_{N+2}$ is connected to the frequency division pulse $P_{[n+1]modN}$ through the port $Y_{[n+1]modN}$, and by analogy, a third input terminal $K_{2N}$ is connected to the frequency division pulse $P_{n-1}$ through the port $Y_{n-1}$; a fourth input terminal $T_1$ is connected to a status control signal $V_n$<n>, a fourth input terminal $T_2$ is connected to a status control signal $V_{[n+1]mod2N}$<n>, and by analogy, a fourth input terminal $T_{2N}$ is connected to a status control signal $V_{n-1}$<n>; and an output terminal R outputs an $n^{th}$ random clock $\Phi_n$ through a port $Z_n$.

For a $(2N+1)^{th}$ clock random distributor CRD(N+1), a first input terminal L is connected to the input clock CLKIN through the port CK; a second input terminal $J_1$ is connected to the frequency division clock $K_1$ through a port $X_1$, a second input terminal $J_2$ is connected to the frequency division clock $K_2$ through a port $X_2$, and by analogy, a second input terminal $J_2$N is connected to the frequency division clock $K_2$N through a port $X_2$N; a third input terminal $K_1$ is connected to the frequency division pulse $P_1$ through a port $Y_1$, a third input terminal $K_2$ is connected to the frequency division pulse $P_2$ through a port $Y_2$, and by analogy, a third input terminal $K_N$ is connected to the frequency division pulse PN through a port $Y_N$; a third input terminal $K_{N+1}$ is connected to the frequency division pulse $P_1$ through the port $Y_1$, a third input terminal $K_{N+2}$ is connected to the frequency division pulse $P_2$ through the port $Y_2$, and by analogy, a third input terminal $K_{2N}$ is connected to the frequency division pulse PN through the port $Y_N$; a fourth input terminal $T_1$ is connected to a status control signal $V_1$<2N+1>, a fourth input terminal $T_2$ is connected to a status control signal $V_2$<2N+1>, and by analogy, a fourth input terminal $T_{2N}$ is connected to a status control signal $V_{2N}$<2N+1>; and an output terminal R outputs a $(2N+1)^{th}$ random clock $\Phi_{2N+1}$ through a port $Z_{2N+1}$.

Figure 9:
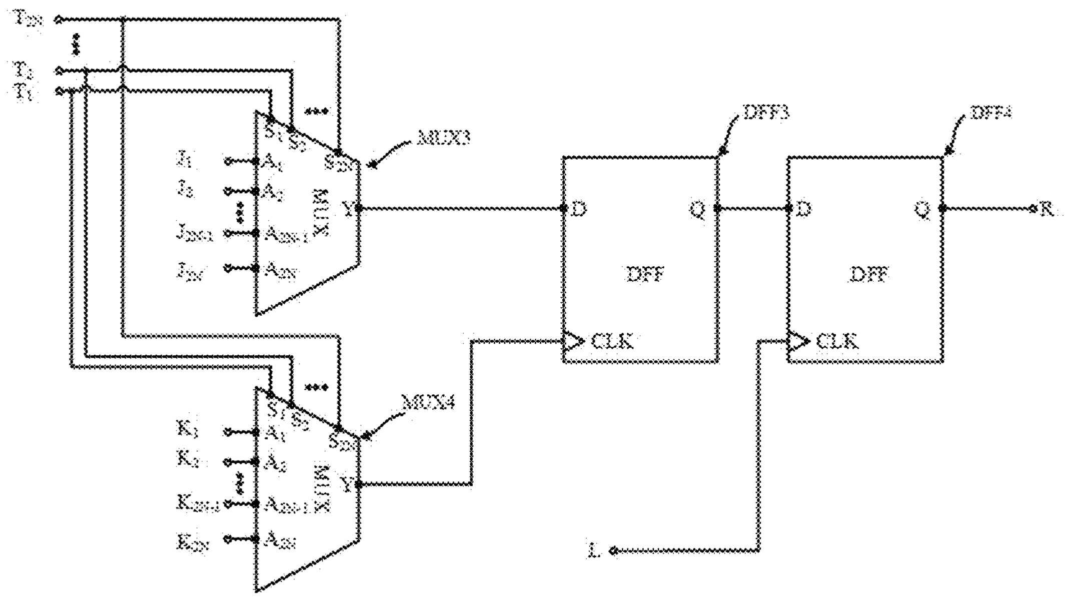
FIG. 9 is a circuit diagram of a clock random distributor in FIG. 8.

In an embodiment, as shown in FIG. 9, the clock random distributor includes a third data selector MUX3, a fourth data selector MUX4, a third D flip-flop DFF3, and a fourth D flip-flop DFF4; 2N address input terminals $S_1$, $S_2$, . . . , and $S_{2N}$ of the third data selector DFF3 and 2N address input terminals $S_1$, $S_2$, . . . , and $S_{2N}$ of the fourth data selector MUX4 are connected and serve as the 2N fourth input terminals $T_1$, $T_2$, . . . , and $T_{2N}$ of the clock random distributor; 2N data input terminals $A_1$, $A_2$, . . . , and $A_{2N}$ of the third data selector MUX 3 serve as the 2N second input terminals $J_1$, $J_2$, . . . , and $J_{2N}$ of the clock random distributor, and a data output terminal Y of the third data selector MUX3 is connected to a data input terminal D of the third D flip-flop DFF3; and 2N data input terminals $A_1$, $A_2$, . . . , and $A_{2N}$ of the fourth data selector MUX4 serve as the 2N third input terminals $K_1$, $K_2$, . . . , and $K_{2N}$ of the clock random distributor, a data output terminal Y of the fourth data selector MUX4 is connected to a clock input terminal CLK of the third D flip-flop DFF3, a data output positive terminal Q of the third D flip-flop DFF3 is connected to a data input terminal Q of the fourth D flip-flop DFF4, a clock input terminal CLK of the fourth D flip-flop DFF4 serves as the first input terminal L of the clock random distributor, and a data output positive terminal Q of the fourth D flip-flop DFF4 serves as the output terminal R of the clock random distributor.

Q is an even number 2N, phases of the Q frequency division clocks are different from each other, and Q/2 frequency division clocks are phase-inverted with respect to the other Q/2 frequency division clocks in a one-to-one correspondence, that is, the frequency division clock $K_{N+1}$ is phase-inverted with respect to the frequency division clock $K_1$, the frequency division clock $K_{N+2}$ is phase-inverted with respect to the frequency division clock $K_2$, . . . , and the frequency division clock $K_{2N}$ is phase-inverted with respect to the frequency division clock $K_N$.

In the low-jitter random clock generation circuit according to the present disclosure, reset/set processing needs to be performed on the register in the status control module during each time of power-on, to ensure that the status control module starts to work from a specified state during each time of power-on. As shown in FIG. 2, RST1_0<M:1>, . . . , and RST2N_3<M:1> input to the status control module according to the present disclosure are all power-on reset/set signals, that is, RST1_0<M:1>, . . . , and RST2N_3<M:1> are either connected to a fixed logic low level or connected to a reset signal RST. A working timing relationship between the reset/set signal and the frequency division clock is shown in FIG. 10.

Figure 10:
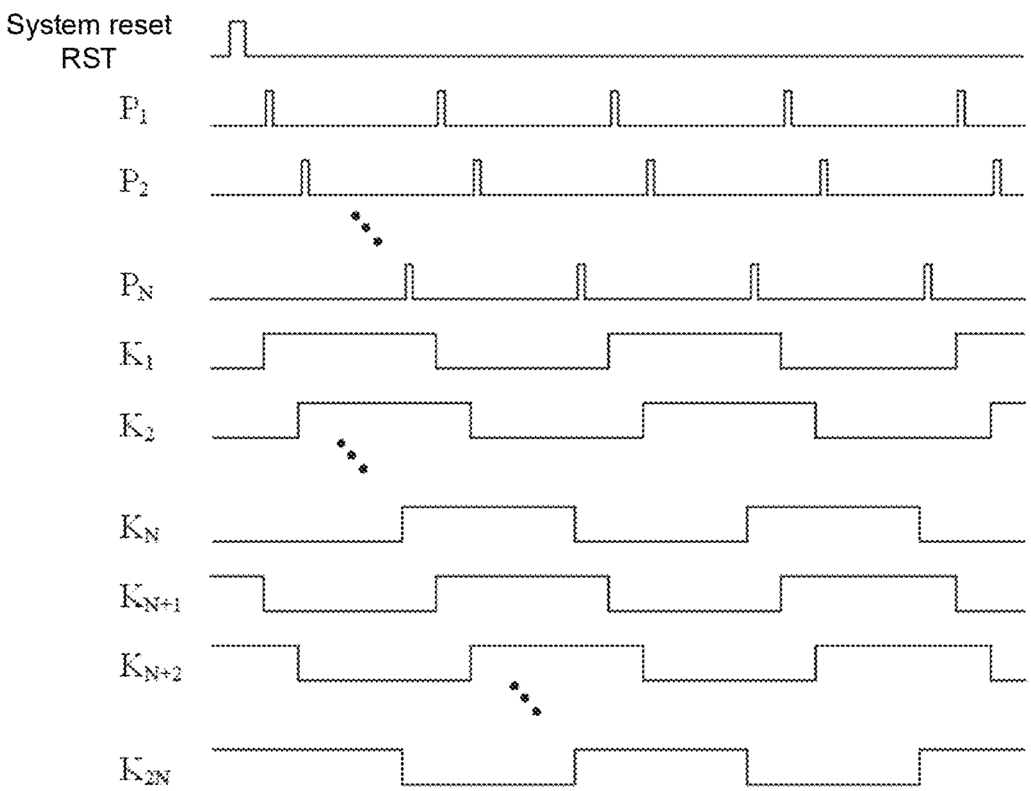
FIG. 10 is a status diagram of working timing of the low-jitter random clock generation circuit in FIG. 2.

A schematic diagram of working timing of the low-jitter random clock generation circuit according to the present disclosure is shown in FIG. 10. The clocks $K_1$, $K_2$, . . . , and $K_{2N}$ are frequency division clocks obtained after 2N-time frequency division. The frequency division clock $K_1$ is phase-inverted with respect to the frequency division clock $K_{N+1}$, the frequency division clock $K_2$ is phase-inverted with respect to the frequency division clock $K_{N+2}$, and by analogy, the frequency division clock $K_N$ is phase-inverted with respect to the frequency division clock $K_{2N}$. The frequency division pulse $P_1$ is output on a rising edge and a falling edge of $K_1$, and by analogy, the frequency division pulse $P_N$ is output on a rising edge and a falling edge of KN. As shown in FIG. 9, under control of the status control signals $V_1$<2N+1:1>, $V_2$<2N+1:1>, . . . , $V_{2N-1}$<2N+1:1>, and $V_{2N}$<2N+1:1> connected to the fourth input terminals $T_1$, $T_2$, . . . , and $T_{2N}$, the frequency division clocks $K_1$, $K_2$, . . . , and $K_{2N}$ are selected to the data input terminal D of the third D flip-flop DFF3 in FIG. 9, and the frequency division pulses $P_1$, $P_2$, . . . , and PN are selected to the clock input terminal CLK of the third D flip-flop DFF3 in FIG. 9. The selected frequency division pulses can ensure accurate capture of the selected frequency division clocks. An output of the third D flip-flop DFF3 is synchronously output by using the fourth flip-flop DFF4. Fourth flip-flops DFF4 in all the clock distributors are synchronously triggered by using the input clock CLKIN as a master clock, which features a stable duty cycle and low jitter.

Figure 11:
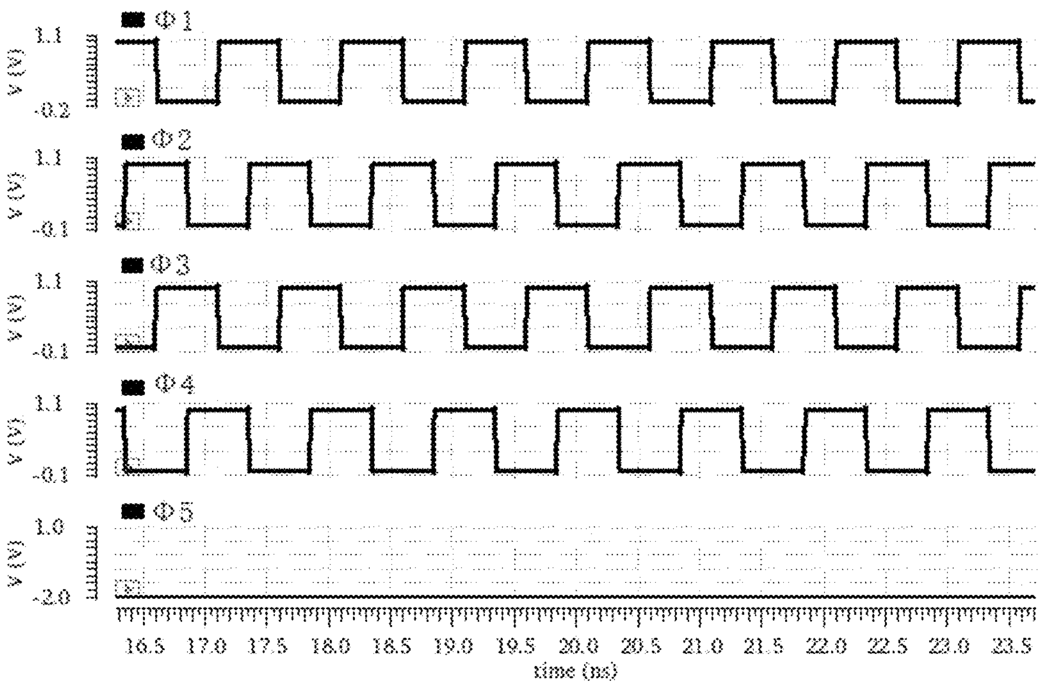
FIG. 11 is a schematic diagram of random clock output simulation when a random function of a low-jitter random clock generation circuit is disabled according to an optional embodiment of the present disclosure.
Figure 12:
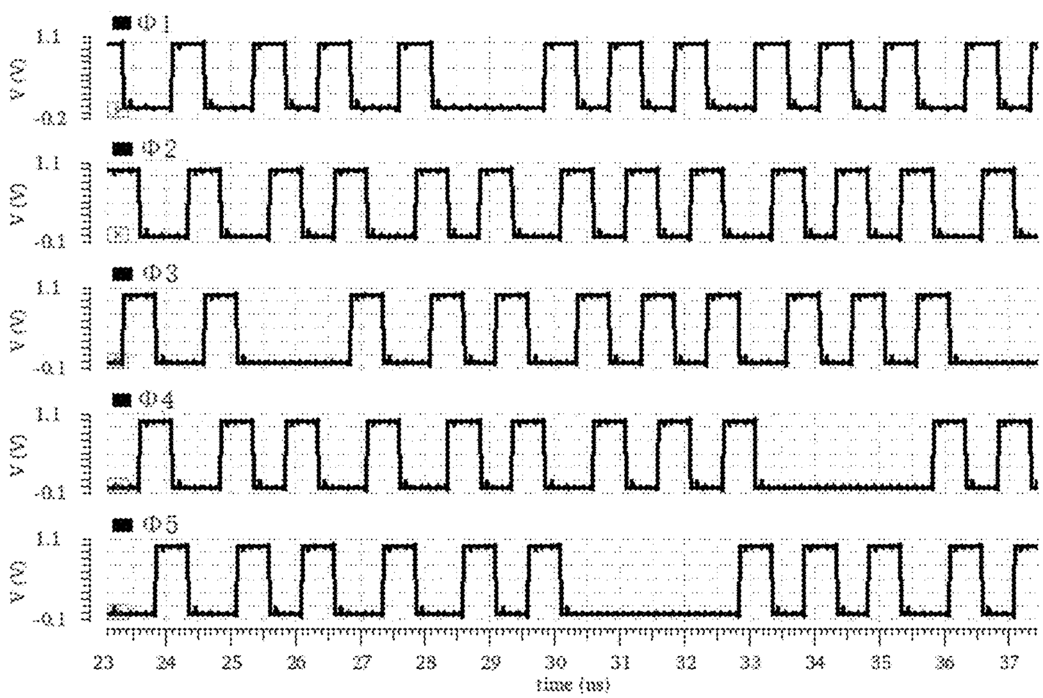
FIG. 12 is a schematic diagram of random clock output simulation when a random function of a low-jitter random clock generation circuit is enabled according to an optional embodiment of the present disclosure.

In an optional embodiment of the present disclosure, N=2 is used as an example to perform a simulation experiment on the low-jitter random clock generation circuit according to the present disclosure, to obtain random clock outputs of the low-jitter random clock generation circuit, as shown in FIG. 11 and FIG. 12. FIG. 11 is a schematic diagram of random clock output simulation when a random function is disabled (that is, there is no random function). An output clock on a fifth channel is low, there is a fixed mode between frequency division clocks on a first channel, a second channel, a third channel, and a fourth channel, and phases are sequentially 0°, 90°, 180°, and 270°. FIG. 12 is a schematic diagram of random clock output simulation when a random function is enabled (that is, there is a random function). Based on different random sequences, four channels are selected from five channels. As shown in FIG. 12, a fifth channel participates in working, and a mode between the channels is no longer fixed.

Figure 13:
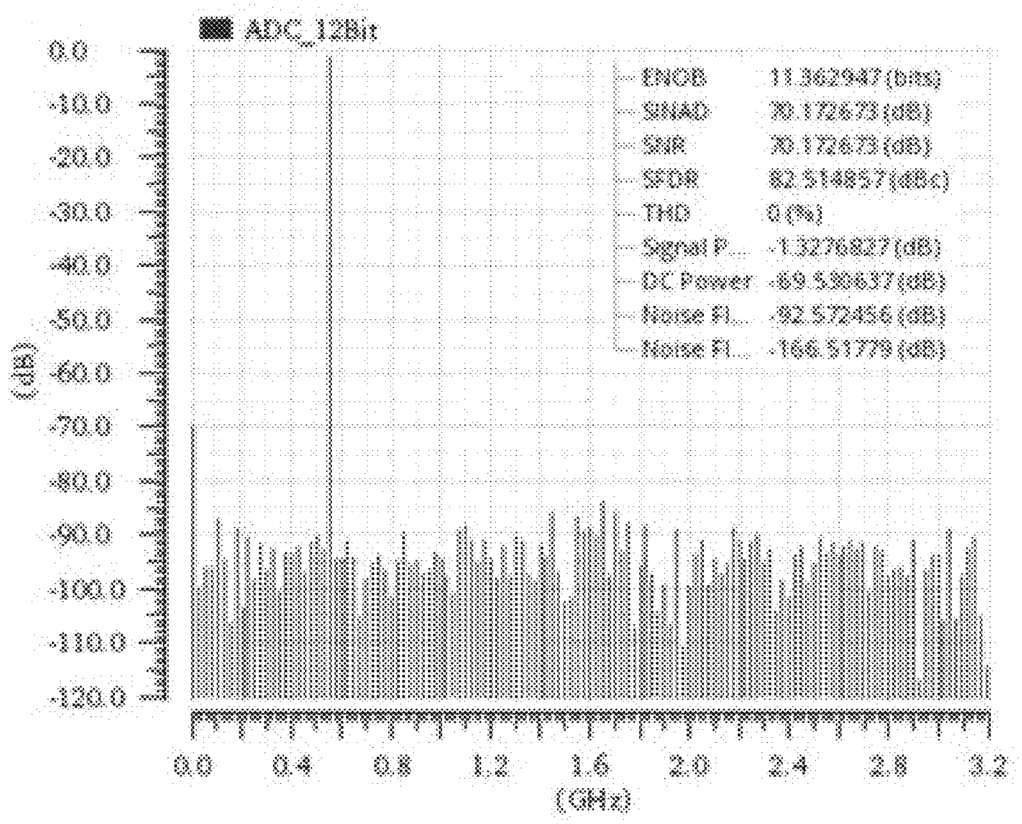
FIG. 13 is a schematic diagram of spectrum simulation after a low-jitter random clock generation circuit is applied to a 12-bit time-interleaved analog-to-digital converter according to an embodiment of the present disclosure.

To further verify the technical effects of the present disclosure, spectrum simulation obtained after the low-jitter random clock generation circuit according to the present disclosure is applied to a 12-bit time-interleaved analog-to-digital converter is shown in FIG. 13. It can be learned from FIG. 13 that the low-jitter random clock generation circuit according to the present disclosure effectively converts time-interleaved spurious components into white noise, thereby improving a spurious-free dynamic range SFDR and linearity of the time-interleaved analog-to-digital converter.

In conclusion, in the low-jitter random clock generation circuit provided in the present disclosure, the low-jitter random clock generation circuit is designed based on a structure of "clock division and pulse generation module+pseudorandom number generation module+status control module+random clock output module". Based on a pseudorandom number generated by the pseudorandom number generation module, a status control signal whose status varies with the pseudorandom number is generated in the status control module. In the random clock output module, a frequency division clock is randomly sampled by using a frequency division pulse under control of the status control signal varying with the pseudorandom number, and the randomly sampled frequency division clock is synchronously output by using an input clock, to obtain a random clock. The two consecutive clock signals are a relatively high-speed frequency division pulse and an input clock serving as a master clock, and feature a stable duty cycle and low jitter. The low-jitter random clock generation circuit is designed as an overall modular structure, can be implemented by using a fully digital structure, and features zero static power consumption and a high speed. The low-jitter random clock generation circuit can be scaled down with a device characteristic size and can be implemented by using a CMOS or BiCMOS process, and therefore is widely applicable.

The foregoing embodiments merely illustrate principles and effects of the present disclosure, but are not intended to limit the present disclosure. Any person skilled in the art may modify or alter the foregoing embodiments without departing from the present disclosure. Therefore, all equivalent modifications or alterations completed by a person of ordinary skill in the art should still be covered by the claims of the present disclosure.

What is claimed is:

1. A low-jitter random clock generation circuit, comprising:

a clock division and pulse generation module, configured to: be connected to an input clock, perform frequency division processing on the input clock to obtain a plurality of frequency division clocks, and then detect some frequency division clocks one by one to obtain a plurality of frequency division pulses in a one-to-one correspondence;

a pseudorandom number generation module, configured to: be connected to one frequency division clock, and generate a pseudorandom number based on the frequency division clock;

a status control module, configured to: be connected to all the frequency division clocks and the pseudorandom number, and generate a plurality of status control signals based on the frequency division clocks and the pseudorandom number; and a random clock output module, configured to: be connected to the input clock, all the frequency division clocks, all the frequency division pulses, and all the status control signals, randomly sample the frequency division clocks by using the frequency division pulses under control of the status control signals, and synchronously output the randomly sampled frequency division clocks by using the input clock, to obtain random clocks.

2. The low-jitter random clock generation circuit according to claim 1, wherein the clock division and pulse generation module comprises:

a clock division unit, wherein an input terminal of the clock division unit is connected to the input clock, and the clock division unit is configured to perform frequency division processing on the input clock to obtain a plurality of frequency division clocks and output the plurality of frequency division clocks one by one to the outside by using a plurality of output terminals of the clock division unit; and a plurality of edge detection units, wherein input terminals of the plurality of edge detection units are connected to some of the plurality of output terminals of the clock division unit in a one-to-one correspondence, and the edge detection unit is configured to perform edge detection on the frequency division clock to obtain the frequency division pulse and output the frequency division pulse to the outside by using an output terminal of the edge detection unit.

3. The low-jitter random clock generation circuit according to claim 2, wherein the edge detection unit comprises a buffer and an XOR gate, an input terminal of the buffer is configured to serve as an input terminal of the edge detection unit, the input terminal of the buffer is connected to a first input terminal of the XOR gate, an output terminal of the buffer is connected to a second input terminal of the XOR gate, and an output terminal of the XOR gate is configured to serve as the output terminal of the edge detection unit.

4. The low-jitter random clock generation circuit according to claim 1, wherein the pseudorandom number comprises a 1-bit pseudorandom sequence of any length.

5. The low-jitter random clock generation circuit according to claim 1, wherein the clock division and pulse generation module is configured to generate Q frequency division clocks, the status control module comprises Q status control units, a first input terminal of a first status control unit is connected to a first output terminal of a $Q^{th}$ status control unit, a first input terminal of an $i^{th}$ status control unit is connected to a first output terminal of an $(i-1)^{th}$ status control unit, a second input terminal of a $j^{th}$ status control unit is connected to a $j^{th}$ frequency division clock, a third input terminal of the $j^{th}$ status control unit is connected to the pseudorandom number, a plurality of reset terminals/set terminals of the $j^{th}$ status control unit are connected to corresponding power-on reset/set signals one by one respectively, and a second output terminal of the $j^{th}$ status control unit outputs a $j^{th}$ status control signal, wherein Q is an integer greater than or equal to 2, i is an integer from 2 to Q, and j is an integer from 1 to Q.

6. The low-jitter random clock generation circuit according to claim 5, wherein the status control unit comprises:

M timing subunits, wherein first input terminals of the M timing subunits are connected and serve as the second input terminal of the status control unit, second input terminals of the M timing subunits are connected and serve as the third input terminal of the status control unit, a third input terminal of a $k^{th}$ timing subunit serves as a subport of the first input terminal of the status control unit, two reset terminals of the $k^{th}$ timing subunit are connected to corresponding power-on reset signals one by one respectively, two set terminals of the $k^{th}$ timing subunit are connected to corresponding power-on set signals one by one respectively, and a second output terminal of the $k^{th}$ timing subunit serves as a subport of the first output terminal of the status control unit; and an encoder, wherein M input terminals of the encoder are connected to first output terminals of the M timing subunits in a one-to-one correspondence, an output terminal of the encoder serves as the second output terminal of the status control unit, and the output terminal of the encoder comprises Q+1 parallel subports, wherein M is an integer greater than or equal to 2, k is an integer from 1 to M, and $2^M \geq Q+1$.

7. The low-jitter random clock generation circuit according to claim 6, wherein the timing subunit comprises a first data selector, a second data selector, a first D flip-flop, and a second D flip-flop; an address input terminal of the first data selector and an address input terminal of the second data selector are connected and serve as the second input terminal of the timing subunit; a second data input terminal of the first data selector and a first data input terminal of the second data selector are connected and serve as the third input terminal of the timing subunit; a data output terminal of the first data selector is connected to a data input terminal of the first D flip-flop, a set terminal of the first D flip-flop serves as a first set terminal of the timing subunit, a reset terminal of the first D flip-flop serves as a first reset terminal of the timing subunit, a data output positive terminal of the first D flip-flop is connected to both a first data input terminal of the first data selector and a second data input terminal of the second data selector, and the data output positive terminal of the first D flip-flop serves as the first output terminal of the timing subunit; a data output terminal of the second data selector is connected to a data input terminal of the second D flip-flop, a set terminal of the second D flip-flop serves as a second set terminal of the timing subunit, a reset terminal of the second D flip-flop serves as a second reset terminal of the timing subunit, and a data output positive terminal of the second D flip-flop serves as the second output terminal of the timing subunit; and a clock input terminal of the first D flip-flop and a clock input terminal of the second D flip-flop are connected and serve as the first input terminal of the timing subunit.

8. The low-jitter random clock generation circuit according to claim 7, wherein the random clock output module comprises Q+1 clock random distributors disposed in parallel, a first input terminal of an $m^{th}$ clock random distributor is connected to the input clock, Q second input terminals of the $m^{th}$ clock random distributor are connected to the Q frequency division clocks in a one-to-one correspondence, Q third input terminals of the $m^{th}$ clock random distributor are correspondingly connected to all the frequency division pulses, with one frequency division pulse being separately connected to two third input terminals, Q fourth input terminals of the $m^{th}$ clock random distributor are connected to the Q status control signals in a one-to-one correspondence, and an output terminal of the $m^{th}$ clock random distributor outputs an $m^{th}$ random clock; and the random clock output module generates and outputs Q+1 random clocks, phases of the Q+1 random clocks are different from each other, and a relative phase relationship of the Q+1 random clocks varies with the pseudorandom number, wherein m is an integer from 1 to Q+1.

9. The low-jitter random clock generation circuit according to claim 8, wherein the clock random distributor comprises a third data selector, a fourth data selector, a third D flip-flop, and a fourth D flip-flop; Q address input terminals of the third data selector and Q address input terminals of the fourth data selector are connected and serve as the Q fourth input terminals of the clock random distributor; Q data input terminals of the third data selector serve as the Q second input terminals of the clock random distributor, and a data output terminal of the third data selector is connected to a data input terminal of the third D flip-flop; and Q data input terminals of the fourth data selector serve as the Q third input terminals of the clock random distributor, a data output terminal of the fourth data selector is connected to a clock input terminal of the third D flip-flop, a data output positive terminal of the third D flip-flop is connected to a data input terminal of the fourth D flip-flop, a clock input terminal of the fourth D flip-flop serves as the first input terminal of the clock random distributor, and a data output positive terminal of the fourth D flip-flop serves as the output terminal of the clock random distributor.

10. The low-jitter random clock generation circuit according to claim 9, wherein Q is an even number, phases of the Q frequency division clocks are different from each other, and Q/2 frequency division clocks are phase-inverted with respect to the other Q/2 frequency division clocks in a one-to-one correspondence.

* * * * *